United States Patent
Mueller-Meskamp et al.

(10) Patent No.: US 10,388,514 B2
(45) Date of Patent: Aug. 20, 2019

(54) ENGINEERING OF FERROELECTRIC MATERIALS IN SEMICONDUCTOR DEVICES BY SURFACE POTENTIAL MODULATION

(71) Applicant: GLOBALFOUNDRIES Inc., Grand Cayman (KY)

(72) Inventors: Lars Mueller-Meskamp, Dresden (DE); Stefan Duenkel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/729,815

(22) Filed: Oct. 11, 2017

(65) Prior Publication Data
US 2019/0108998 A1    Apr. 11, 2019

(51) Int. Cl.
| | |
|---|---|
| *H01L 21/02* | (2006.01) |
| *H01L 21/762* | (2006.01) |
| *H01L 29/78* | (2006.01) |
| *H01L 21/265* | (2006.01) |
| *H01L 21/223* | (2006.01) |
| *H01L 29/06* | (2006.01) |
| *H01L 29/66* | (2006.01) |

(52) U.S. Cl.
CPC .. *H01L 21/02299* (2013.01); *H01L 21/02172* (2013.01); *H01L 21/2236* (2013.01); *H01L 21/26506* (2013.01); *H01L 21/76267* (2013.01); *H01L 21/76283* (2013.01); *H01L 29/0649* (2013.01); *H01L 29/66477* (2013.01); *H01L 29/7841* (2013.01)

(58) Field of Classification Search
CPC ......... H01L 21/02299; H01L 21/02172; H01L 21/2236; H01L 21/26506; H01L 21/76267; H01L 11/76283; H01L 29/0649; H01L 21/66477; H01L 21/7841
USPC ....................................................... 257/506
See application file for complete search history.

(56) References Cited

U.S. PATENT DOCUMENTS

| | | | |
|---|---|---|---|
| 9,548,298 B1* | 1/2017 | Tian ................... H01L 27/0623 |
| 2012/0018812 A1* | 1/2012 | Anderson ............. G06F 17/505 |
| | | | 257/392 |
| 2016/0064228 A1* | 3/2016 | van Bentum ..... H01L 21/28185 |
| | | | 257/295 |

OTHER PUBLICATIONS

Batra et al., "Stabilization of metastable phases in hafni owing to surface energy effects," Applied Physics Letters, 108, 172902, 2016.
(Continued)

*Primary Examiner* — Tong-Ho Kim
(74) *Attorney, Agent, or Firm* — Amerson Law Firm, PLLC (57) ABSTRACT

In semiconductor devices, high-k dielectric materials may be formed on the basis of engineered surface conditions, thereby contributing to superior uniformity of the resulting characteristics. In some illustrative embodiments, the dielectric material may be stabilized in a ferroelectric phase, wherein the previous surface modulation, which, in the illustrative embodiments may include the introduction of respective species, such as dopant species, thereby contributing to uniform ferroelectric characteristics. In some illustrative embodiments, the process strategy may be applied to a buried insulating layer of an SOI substrate.

20 Claims, 6 Drawing Sheets

(56) References Cited

OTHER PUBLICATIONS

Lomenzo et al., "Ferroelectric Si-Doped HfO2 Device Properties on Highly Doped Germanium," IEEE Electron Device Letters, 36:766-68, Aug. 2015.

* cited by examiner

ENGINEERING OF FERROELECTRIC MATERIALS IN SEMICONDUCTOR DEVICES BY SURFACE POTENTIAL MODULATION

BACKGROUND

1. Field of the Disclosure

Generally, the present disclosure relates to semiconductor devices and respective manufacturing techniques in which ferroelectric materials may be implemented in view of extending functionality and/or enhancing performance of circuit elements of sophisticated semiconductor devices.

2. Description of the Related Art

Significant progress has been made in the field of semiconductor devices over the recent decades due to the continuous reduction of critical dimensions of field effect transistors. In recent developments, critical dimensions of transistor elements have reached 30 nm and even less in sophisticated planar device architectures, thereby achieving extremely high integration density and, therefore, providing the possibility of integrating more and more functions into a single integrated circuit. For example, the CMOS technique has proven to be a viable concept of forming powerful logic devices, such as microprocessors and the like, wherein P-type transistor elements and N-type transistor elements represent the backbone of high performance, low power semiconductor devices. Many of the advantages of sophisticated semiconductor devices have been gained by steadily reducing critical dimensions of respective circuit elements, wherein, however, a plurality of associated problems have to be addressed in order to fully exploit many of the performance advantages achieved by reduced critical dimensions. For example, dielectric materials used for isolating specific conductive regions from each other may give rise to a certain capacitance that significantly depends on the dielectric constant of the respective dielectric material. In some instances, the capacitance associated with the provision of a dielectric material between two conductive regions of a semiconductor device may be considered as an important characteristic for the correct functioning of such devices when a respective capacitive coupling is a necessity for the correction functional behavior. In other cases, a corresponding capacitance associated with a dielectric material may be considered as a parasitic capacitance and may, therefore, result in performance degradation of sophisticated circuit elements, such as field effect transistors and the like.

In many approaches, complex high-k dielectric material systems have been developed in an attempt to further improve overall transistor performance, wherein it has been recognized that some of these material systems may have ferroelectric characteristics, which may also be taken advantage of upon forming sophisticated transistor devices, capacitors and the like. Therefore, great efforts are being made in establishing material systems having ferroelectric characteristics.

In "Stabilization of metastable phases in hafnia owing to surface energy effects," Batra et al., *Applied Physics Letters*, 108:172902, 2016, it is speculated that metastable polar phases of hafnium oxide may be stabilized on the basis of finite size effects due to small grain sizes and film thickness, wherein these speculations are based on first principle calculations and a very basic model of the total potential energy of hafnium oxide particles of finite dimensions.

In "Ferroelectric Si-Doped $HfO_2$ Device Properties on Highly Doped Germanium," Lomenzo et al., *IEEE Electron Device Letters*, 36:766-68, August 2015, experimental results are provided indicating that the material composition of a surface layer on which a silicon-doped hafnium oxide material is deposited may significantly influence the obtained ferroelectric characteristics, wherein, in particular, a germanium substrate may represent a promising candidate for forming thereon silicon-doped hafnium oxide material so as to exhibit superior ferroelectric characteristics.

Although promising developments may be currently seen in the field of semiconductor fabrication, it, nevertheless, appears that a reliable and flexible process strategy for implementing device characteristics on the basis of high-k dielectric materials into sophisticated semiconductor devices, including, for instance, field effect transistors and the like, may not be presently available.

In view of the situation described above, the present disclosure relates to techniques for providing device characteristics, in particular, for electrostatically influencing charge carriers in a semiconductor region of interest, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that surface areas of a material layer that is to receive or to be in contact with a high-k dielectric material, which in some illustrative embodiments may have the capability of establishing ferroelectric characteristics, may be modulated in order to specifically stabilize a desired phase, such as polar phase, in a substantially repeatable manner. For example, in illustrative embodiments disclosed herein, the surface potential may be modulated so as to promote the stabilization of a specific phase represented by an engineered grain structure. In some illustrative aspects, the specific phase may represent a polar phase. Without intending to restrict the present application to a specific theoretical explanation, it is believed that the surface modulation may allow the definition of surface areas that are comparable in size to respective grains that may form in the high-k dielectric material, possibly having ferroelectric properties, upon depositing and/or treating the high-k dielectric material, thereby inducing the stabilization of a certain type of grain and/or a specific size of grains. The modulation of the surface potential may be accomplished by applying any appropriate treatment or process, such as the introduction of a specific species into a surface area of a base material, depositing an appropriate carrier material on the respective material layer, and the like, in order to provide appropriate lateral dimensions for the subsequent deposition and treatment of the high-k dielectric material.

The surface modulation may be combined or may be performed in consideration of other process parameters involved in the formation of the high-k dielectric material, which may have the capability of establishing a ferroelectric phase, such as deposition parameters, post-deposition treatment parameters, final layer thickness of the high-k dielectric material, and the like, so as to obtain appropriate conditions for stabilizing the desired phase, such as a ferroelectric phase. For instance, when forming a high-k dielectric material on the basis of process parameters which may result in the formation of a random number of grains having a randomly distributed grain size within a specific device region, such as a region corresponding to the channel region of a field effect transistor, the corresponding process parameters may well be in a range suitable for obtaining a desired dielectric constant, however, without imparting desired uniform characteristics to the dielectric material under consideration. On the other hand, by determining appropriate surface modulation conditions, for instance, a certain degree of dopant concentration in a surface layer, a degree of crystallinity and the like, an additional parameter may, thus, be available for defining the high-k characteristics with superior uniformity and, if ferroelectric materials, such as hafnium oxide, are considered, ferroelectric characteristics.

It should be appreciated that the modulation of the surface potential of a corresponding material layer may be understood in a "spatial" meaning, wherein a lateral variation of surface characteristics may be obtained, for instance, by actively masking or patterning certain device areas during the modulation process, such as a surface treatment by ion implantation and the like. In other cases, the modulation may be spatially controlled by taking advantage of specific spatial conditions of certain device regions, such as interfaces and the like, which may result in a spatially modulated surface characteristic. As an example, the interface region formed between the active region of a transistor and the adjacent isolation region may result in a significant spatial modulation of surface characteristics upon introducing a specific species due to the very different diffusion behavior of these neighboring device regions. The modulation of the surface potential may also include the meaning of a "temporary" modulation in which the surface of a material layer, irrespective of whether a specific lateral confinement or a substantially non-masked process is applied, may be brought from a first initial surface condition to a second later surface condition immediately prior to the formation of the high-k dielectric material, wherein the second surface condition may, thus, result in the desired stabilization of a desired grain structure or phase, irrespective of the lateral size of the material layer under consideration. The second surface condition may be altered again in a later stage or the previous first surface condition may be reestablished. For example, substantially amorphizing a crystalline surface layer prior to depositing the high-k dielectric material and reestablishing the crystalline nature of the surface layer in a later stage may correspond to such a temporary surface modulation.

Thus, in some illustrative embodiments disclosed herein, the surface conditions may be adjusted, for instance, by depositing a specific material composition, providing a specific dopant concentration and the like, in a laterally substantially non-patterned manner and/or by using a masking regime or taking advantage of given lateral discontinuities or discontinuities obtained otherwise in a laterally non-patterned process prior to forming the high-k dielectric material, wherein, for instance, the combination of the process parameters of the process for forming the high-k dielectric material, possibly having ferroelectric characteristics, and the surface condition established prior to the formation of the material may suffice to obtain a desired behavior of superior uniformity of the dielectric material under consideration. Consequently, the surface modulation including the provision of, e.g., doped/non-doped areas or semiconductor/oxide areas with specific interface diffusion, may have a significant impact on grain size and nucleation of the high-k dielectric material, thereby engineering desired characteristics of the high-k dielectric material, such as ferroelectric behavior and the like.

One illustrative embodiment disclosed herein relates to a method. The method includes providing a material layer positioned to enable electrostatic influence on charge carriers in a semiconductor region of a semiconductor device, wherein the material layer has a surface at a first condition. The method further includes modulating at least a portion of the surface of the material layer into a second condition that differs from the first condition in at least one surface-relevant parameter. Additionally, the method includes, after modulating the at least a portion of the surface, forming a high-k dielectric material on the surface so as to establish a ferroelectric phase in at least a portion of the high-k dielectric material.

According to a further illustrative embodiment disclosed herein, a method of forming a dielectric material in a semiconductor device is provided. The method includes introducing a species into at least a portion of a surface of a material layer positioned to enable electrostatic influence on charge carriers in an active semiconductor region of a circuit element. Furthermore, the method includes, after introducing the species, forming a dielectric material above the surface so as to establish a ferroelectric phase in at least a portion of the dielectric material.

According to a still further embodiment disclosed herein, a semiconductor device is provided. The semiconductor device includes a dielectric material formed on a material layer positioned to enable electrostatic influence on charge carriers in a semiconductor region, wherein at least portion of the dielectric material is formed in a ferroelectric phase. The material layer comprises a material composition based on one of a metal species and germanium and/or a modulated surface characteristic that is correlated to a grain size of the at least a portion of the dielectric material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As briefly discussed above, many problems have been encountered upon reducing device dimension, and many different routes have been taken in circumventing at least some of the problems associated with the reduction of feature sizes. For example, upon reducing the length of a conductive channel of a field effect transistor, the influence of contribution of edge areas of the gate electrode structure formed above the channel region and separated therefrom by a dielectric material may finally result in insufficient controllability of the channel region upon applying a specific voltage to the gate electrode structure. Consequently, when attempting to increase overall channel controllability, the capacitive coupling between the gate electrode and the channel region may be increased by reducing the thickness of the gate dielectric material. A reduced physical thickness of the gate dielectric material, however, may entail adverse side effects, such as less robustness with respect to a voltage between the gate electrode and the drain and/or source regions of the field effect transistor, thereby typically requiring a further reduction of the operating voltage of respective semiconductor devices. This, in turn, may not only contribute to superior robustness of the gate dielectric material in view of electrical breakdown of the gate dielectric material, but may also provide reduced overall power consumption due to reduced dynamic losses, which may, for instance, be attributed to the charging and discharging of any parasitic capacitances. On the other hand, the reduced physical thickness of the gate dielectric material, or of any other dielectric material used, for instance, in capacitors and the like, may result in increased leakage currents into and through the gate dielectric material for a given operating voltage.

In present sophisticated semiconductor devices, a thickness of a gate dielectric material formed on the basis of "standard" materials, such as silicon dioxide, may have reached a value of 1.5 nm and even less, thereby rendering such devices as less than desirable in view of gate dielectric robustness, leakage currents and the like. Consequently, new material systems have been developed which may provide an oxide equivalent thickness that is appropriate for sophisticated circuit elements, such as field effect transistors, capacitors and the like, which, however, may provide a significantly increased physical thickness. To this end, so-called "high-k" dielectric materials have been introduced in semiconductor devices in order to preserve a desired high capacitive coupling, while ensuring reduced leakage currents and increased robustness with respect to electrical breakthrough by providing an appropriate physical thickness of at least several nanometers. When implementing new material systems into the highly complex manufacturing sequence for forming advanced semiconductor devices, the preservation of a high degree of compatibility with existing processes and materials is typically sought. For instance, a plurality of material or material systems has been identified as potential candidates for dielectric materials for transistors, capacitors and the like. For instance, hafnium oxynitride, zirconium oxide, aluminum oxide, hafnium oxide and the like may be frequently employed as dielectric materials, alone or in combination, in order to provide superior characteristics of the respective dielectric materials. As used herein and in the appended claims, the terms "high-k materials", "high-k dielectric materials", "high-k insulating materials" or the like shall be understood to mean a material having a dielectric constant (k value) of at least 10 or greater.

Consequently, respective material systems and process techniques have been developed in which high-k dielectric materials may be successfully implemented into, for instance, gate electrode structures, in order to provide superior robustness and increased capacitive coupling. Typically, the implementation of a high-k dielectric material into the gate electrode structure of a transistor may also require the adaptation of other material systems, such as a portion of the gate electrode material, in order to adjust respective transistor characteristics and the like. For example, the electrostatic influence of highly doped polycrystalline silicon material as gate electrode material may no longer suffice for appropriately adjusting a threshold voltage in the semiconductor channel of a field effect transistor, thereby requiring the formation of respective threshold voltage-adjusting materials, for instance, containing a metal species, such as aluminum and the like, in combination with appropriately highly conductive metal-containing barrier materials, such as titanium nitride, tantalum nitride and the like.

Although the implementation of high-k dielectric materials for controlling channel regions of sophisticated transistor elements may significantly contribute to the potential of further device scaling, additional control mechanisms may, nevertheless, be frequently implemented in order to obtain superior channel controllability and/or the adjustment of basis transistor characteristics, such as threshold voltage and the like. For example, a so-called "back bias" regime may be implemented, in which a substrate material may have an appropriate dopant concentration and may be connected to a respective control voltage, thereby also providing the possibility of influencing charge carriers in the actual active semiconductor region. This region is to be understood as a semiconductor region in which a conductive channel may form upon applying an appropriate control voltage to the gate electrode structure. Such additional control mechanisms may be implemented with superior efficiency in SOI (semiconductor- or silicon-on-insulator) configurations, in which a buried insulating layer is typically formed below the active semiconductor region, thereby electrically separating the active semiconductor region from the substrate material. In sophisticated semiconductor devices in which, for example, the thickness of the buried insulating layer may also be reduced, the substrate material below the buried insulating layer may be used as an additional electrode for electrostatically influencing charge carriers in the actual active semiconductor region through the buried insulating layer.

In addition to superior controllability of a channel region of a transistor element upon further device scaling, additional functionality may typically also have to be implemented into sophisticated semiconductor devices, wherein one of these functionalities may be seen in a non-volatile storage of a certain device state.

For instance, in complex control logic circuitry, efficient memory areas, such as static and dynamic random access memory (RAM) portions, may be typically required in order to at least temporarily store one or more respective logic states. Although powerful techniques and device configurations have been developed for dynamic and static RAM devices, it turns out that, in many applications, a permanent, yet changeable, storage of certain device states may be necessary. Consequently, great efforts have been made in developing storage elements, such as transistors, in which a certain device state may be stored so as to be preserved even upon terminating the supply voltage of the corresponding semiconductor device, while still providing the possibility of changing the state of the storage element at any given time during operation of the respective semiconductor device.

For instance, in some approaches, a charge-trapping material may be implemented at an appropriate position at which electrostatic influence on charge carriers of semiconductor regions may be achieved, wherein the degree of influence, thus, depends on the amount of charge incorporated in the charge-trapping material. Since the charge-trapping material is designed to avoid a significant loss of charge carriers under normal operating voltages, a respective state correlated with the corresponding amount of charge carriers in the charge-trapping material may, therefore, be preserved even upon turning off the supply voltage. On the other hand, charge carriers may be injected into or removed from the charge-trapping material upon applying an appropriate "programming" voltage during operation of the semiconductor device under consideration, thereby providing the possibility of changing the state-to-be-stored by means of the charge-trapping material.

Although the technique described above may, in principle, provide efficient non-volatile storage elements, it appears that significant efforts in terms of the overall process strategy may be involved, while overall performance may also be considered as being inadequate for sophisticated applications.

Therefore, other approaches are under investigation, wherein, as briefly discussed above, the incorporation of a ferroelectric material may be considered as a viable way of implementing non-volatile storage capabilities in sophisticated semiconductor devices. During the course of identifying appropriate material systems for implementing ferroelectric functionality into a material system of a semiconductor device, it has been recognized that hafnium oxide, for instance, which is frequently used as a high-k dielectric material, may also exhibit ferroelectric characteristics, in particular, when provided in the form of a moderately thin layer. Hafnium oxide may be typically formed on the basis of CVD (chemical vapor deposition) techniques, wherein, in some approaches, respective precursor materials may be supplied in different deposition steps, thereby obtaining a well-defined self-limiting deposition, wherein the final layer thickness may, therefore, be determined by the number of self-limiting deposition cycles. A corresponding CVD technique may also be referred to as ALD (atomic layer deposition).

In other cases, the precursor materials, including hafnium and oxygen, may be supplied concurrently, for instance, on the basis of a metal organic compound and an oxygen-containing material, thereby inducing a chemical reaction of these precursor materials at the surface of the substrate. In some approaches, the deposition of the hafnium oxide material as a substantially amorphous material has been attempted, which may be considered advantageous in reducing overall leakage currents, thereby also being advantageous for gate dielectric layers. It has been recognized, however, that hafnium oxide may also be obtained in a more or less crystalline form, wherein substantially crystallized grains of varying size may be present in the layer, which may, however, result in increased leakage currents, while on the other hand, a significantly higher dielectric constant may be obtained. For example, respective substantially crystalline grains may be obtained on the basis of high temperature phases of hafnium oxide, wherein respective phases may also be stable at room temperature, for instance, by appropriate treatment of the resulting hafnium oxide material, such as rapid cooling and the like. Furthermore, it has been recognized that, in addition to the equilibrium monoclinic phase and the high temperature tetragonal phase of hafnium oxide, other meta-stable phases may occur, such as a polar orthorhombic phase, thereby imparting ferroelectric characteristics to the respective hafnium oxide material. Since hafnium oxide is well established in the semiconductor industry due to its compatibility with CMOS manufacturing strategies, great efforts are being made to take advantage of the ferroelectric phases of hafnium oxide in order to provide non-volatile storage capabilities in sophisticated semiconductor devices.

Upon considering the above-referenced circumstances the present disclosure is generally based on the concept that various characteristics of sophisticated circuit elements, such as transistor elements, capacitors and the like, may be significantly influenced by dielectric materials, for instance, those used for capacitive coupling of the gate electrode structure to the channel region of a field effect transistor element and the like. Many dielectric materials having a dielectric constant of 10 or even greater are formed on the basis of a metal oxide, such as hafnium oxide, zirconium oxide and the like, wherein the final characteristics of these materials may significantly depend on their final structure, such as an amorphous structure, a substantially polycrystalline structure and the like. In particular, with respect to high-k dielectric materials, such as hafnium oxide-based dielectric materials, it has been recognized that the final characteristics may substantially depend on the crystallographic structure, since, for example, the dielectric constant depends on the granularity of respective high-k dielectric materials. Since many of these high-k dielectric materials may also exhibit ferroelectric characteristics when brought into a respective ferroelectric phase upon deposition or post-deposition treatments, a wide field of applications may be seen in appropriately configuring the structure of respective high-k dielectric materials.

It has been recognized that providing appropriate surface characteristics, for instance, in terms of the presence of specific dopant species, such as P-type dopants, N-type dopants, substantially "inert" dopants, such as xenon, krypton and the like, or any other species, such as fluorine, boron, germanium and the like, may be used for appropriately modulating or modifying the surface characteristics of a material layer that is positioned in the vicinity of a semiconductor region, the conductivity of which may have to be controlled or at least affected by or through a dielectric material. In this respect, it should be appreciated that a material layer positioned to enable influence on charge carriers in a semiconductor region is to be understood as any material that is positioned in or in the vicinity of the corresponding semiconductor region to be affected by, for instance, electrostatic interaction, by any adjacent material. For instance, the electrostatic interaction may be caused by an electrode material positioned adjacent to a dielectric material, the characteristics of which may, therefore, also significantly contribute to the finally obtained electrostatic effect on charge carriers in the semiconductor region under consideration. In other cases, respective mechanisms, such as specific dopant species and the like, may even be positioned within a corresponding dielectric material, which may then, in combination with its basic configuration, also significantly affect charge carriers in the semiconductor region under consideration.

In some illustrative embodiments disclosed herein, the corresponding electrostatic influence on charge carriers of a semiconductor region may be affected by establishing a ferroelectric phase in the dielectric material positioned in the vicinity of the semiconductor region under consideration. In this respect, it has also been recognized that the crystallinity of the dielectric material, typically a high-k dielectric material, may significantly affect the ferroelectric behavior, which may conventionally contribute to significant device variations due to significant variations of the crystallinity of such dielectric materials, wherein variations may be observed from individual circuit element to individual circuit element and also across different substrates having formed thereon a plurality of individual circuit elements.

The engineering of the crystallinity of respective high-k dielectric materials and, in particular, of dielectric materials having the capability of establishing a ferroelectric phase, may be based on the modification or modulation of the surface potential of a material that may come into contact upon depositing and treating a respective dielectric material, wherein respective modulation processes may be performed so as to obtain the required results with respect to, for instance, grain size and/or number of grains of a respective dielectric material, while otherwise also respecting other parameters, such as layer thickness, basis material composition and the like. That is, if a given range of layer thickness is acceptable for a specific semiconductor device, appropriate modulation processes may be determined, for instance, by experiments and the like, so as to obtain a desired crystallinity of the dielectric material under consideration, while still maintaining the layer thickness thereof within the predetermined allowable range.

With reference to FIGS. 1C-1E, 2A-2E and 3A-3D, further illustrative embodiments will now be described in more detail, wherein reference may also be made to FIGS. 1A and 1B, which refer to conventional device architectures and configurations of a high-k dielectric material.

Figure 1A:
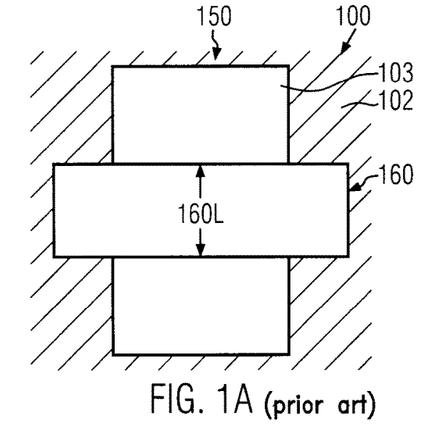
FIG. 1A schematically illustrates a top view of a field effect transistor element in accordance with conventional planar device architectures.

FIG. 1A schematically illustrates a top view of a semiconductor device 100, wherein, for convenience, a single circuit element 150, such as a planar field effect transistor element, is illustrated. The field effect transistor 150 may be selected as a typical example of a circuit element, the performance and characteristics of which may be significantly determined by respective dielectric materials and which may represent a major contributor to performance of sophisticated semiconductor devices, since field effect transistors are the dominant active circuit elements in sophisticated CMOS techniques, as also discussed above.

The semiconductor device 100 may comprise an appropriate substrate material (not shown) in which respective device regions may be laterally delineated by an isolation structure 102, such as a trench isolation structure and the like. Consequently, an active semiconductor region 103 may, thus, be enclosed by the isolation structure 102 and may, therefore, define the basic transistor configuration, together with a gate electrode structure 160. It should be appreciated that, in sophisticated semiconductor devices, the active region 103 may be typically formed of a crystalline semiconductor material, such as silicon, silicon/germanium and the like, since the majority of sophisticated semiconductor devices are presently formed on the basis of a silicon material. In other cases, if considered appropriate, the active region 103 may comprise amorphous semiconductor materials, such as silicon, germanium and the like. It should be appreciated that a length of the gate electrode structure 160, which is basically determined by a corresponding extension of an electrode material of the gate electrode structure, indicated by 160L, may represent one critical dimension of a semiconductor device and may be in the range of 30 nm and significantly less in presently available sophisticated semiconductor devices. Similarly, a width of the transistor element 150 may be substantially defined by an extension of the active region 103 in the transistor width direction, i.e., in FIG. 1A, the horizontal direction. Consequently, the size of the active region 103 and, in particular, the gate length 160L, may represent important parameters for obtaining high integration density and superior transistor performance, as already discussed above, while, at the same time, necessitating adaptation and employment of specific material systems, such as high-k dielectric materials and the like, so as to provide proper functionality of the transistor element 150.

The transistor 150 may be formed in accordance with well-established process strategies in which an appropriate substrate may be processed so as to obtain a desired semiconductor material as an initial basis material for the various active semiconductor regions 103, which may differ in material composition, dopant concentration, size and shape, across the semiconductor device 100, depending on the various types of active circuit elements to be provided within the semiconductor device 100. As discussed above, crystalline silicon material may be frequently used as a base material for forming the active semiconductor regions 103. In order to appropriately laterally define the active regions 103, the isolation structure 102 may be formed, for instance, by sophisticated lithography, etch, deposition and planarization techniques, followed by a complex process sequence for forming the gate electrode structure 160, which may also involve the deposition of an appropriate gate dielectric material, as already discussed above. To this end, well-established process strategies are available, which, in sophisticated applications, a high-k dielectric material, often on the basis of a hafnium oxide material, may be deposited and treated in order to adjust the final material characteristics thereof.

Figure 1B:
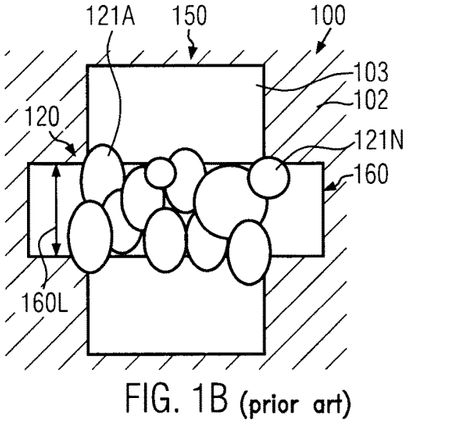
FIG. 1B schematically illustrates a top view of the transistor element including a high-k dielectric material with randomly distributed grain sizes formed in accordance with conventional process strategies.

FIG. 1B schematically illustrates a top view in which, for convenience, a high-k dielectric material 120 is shown so as to be visible through a gate electrode structure 160. The high-k dielectric material 120 may be provided in the form of a hafnium oxide-based material, such as hafnium oxide, silicon-doped hafnium oxide, nitrogen-containing hafnium oxide, or in the form of other metal oxides, such as zirconium oxide and respective deviations thereof, depending on the overall device requirements. In some illustrative embodiments, the dielectric material 120 may be provided in the form of a hafnium oxide-based material. Formation of the high-k dielectric material 120 may involve sophisticated deposition techniques, such as ALD, plasma-enhanced ALD, metal-organic CVD and the like, wherein a relatively precise control of layer thickness and material composition may be achieved. Furthermore, respective post-deposition treatments, such as anneal processes and the like, may be applied in order to obtain a specific crystalline configuration, wherein, typically, a respective number of grains 121A . . . 121N may be formed.

In sophisticated applications, an average size of the grains 121A . . . 121N may be comparable to at least the critical dimension, such as the gate length 160L, of the gate electrode structure 160, which may, therefore, result in an "averaged" behavior of the material 120 that may depend on the number of grains and their respective sizes. That is, although the size of the grains 121A . . . 121N may be substantially restricted to a size comparable to the critical dimension 160L, the actually obtained average size and number of the grains 121A . . . 121N may, nevertheless, be substantially randomly distributed, thereby also obtaining final material characteristics which may exhibit a specific fluctuation, since generally, the number of the grains 121A . . . 121N may be relatively low, yet substantially randomly distributed. That is, the proportional change of the number of grains and/or the sizes thereof from one device to another may, therefore, result in a relatively significant fluctuation of the resulting material characteristics. For example, when selecting deposition conditions and/or post-deposition parameters such that many of the grains 121A . . . 121N when representing, for instance, a hafnium oxide-based material to stabilize in a polar phase, the corresponding ferroelectric behavior may significantly vary according to a corresponding variation of the average number of grains and sizes thereof. Consequently, although the incorporation of high-k dielectric materials in a substantially polycrystalline form may provide advantages, for instance, in terms of increased dielectric constant or, in other cases, by providing this material with a ferroelectric phase, respective fluctuations of material characteristics and, thus, corresponding variations of device performance, may have to be expected, since, as discussed above, the high-k dielectric material 120 may have a significant influence on performance of the transistor element 150.

According to the principles disclosed herein, it has been recognized that, in particular, a modulation of a surface potential may provide an additional mechanism for adjusting the finally obtained material characteristics in order to reduce the resulting pronounced material fluctuations and, thus, device variations.

Figure 1C:
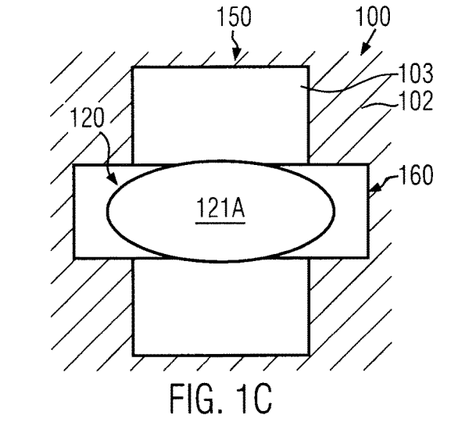
FIGS. 1C-1E schematically illustrate top views of the transistor element including a high-k dielectric material formed on the basis of surface modulation techniques so as to adjust the size and/or number of respective grains, according to illustrative embodiments.

FIG. 1C schematically illustrates a top view of the semiconductor device 100 according to illustrative embodiments disclosed herein, wherein the high-k dielectric material 120 may be formed so as to include grains 121A which may have a size essentially corresponding to the size of the active region 103 covered by the gate electrode structure 160. When preparing the dielectric material 120 in this manner, in some illustrative embodiments, a single grain 121A may be present within the gate electrode structure 160 and may, thus, provide highly uniform and predictable characteristics of the high-k dielectric material 120. In some illustrative embodiments, the grain 121A may represent a ferroelectric phase of, for instance, hafnium oxide-based material, thereby also providing highly homogenous ferroelectric characteristics of the material 120.

Figure 1D:
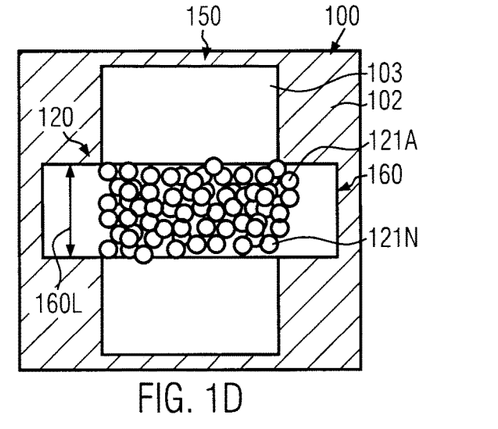

FIG. 1D schematically illustrates a top view of the semiconductor device according to still further illustrative embodiments, in which the size of the grains 121A . . . 121N may be significantly less compared to the critical dimension 160L, while the sizes of the individual grains 121A . . . 121N may also be within a relatively small range, thereby reducing the reduction of spread of the grain sizes, for instance, compared to the situation described with reference to FIG. 1B. Consequently, due to the reduced spread of the grain sizes and reduced overall size of the grains 121A . . . 121N, a relatively large number of grains may be positioned in the gate electrode structure 160, thereby obtaining an average material characteristic that is determined by a moderately large number of individual grains 121A . . . 121N, thereby also reducing the fluctuation from device to device and, thus, obtaining a relatively predictable and homogeneous behavior of the high-k dielectric material 120. This may also be provided in some illustrative embodiments so that at least a significant portion of the grains 121A . . . 121N may exhibit a ferroelectric phase.

Figure 1E:
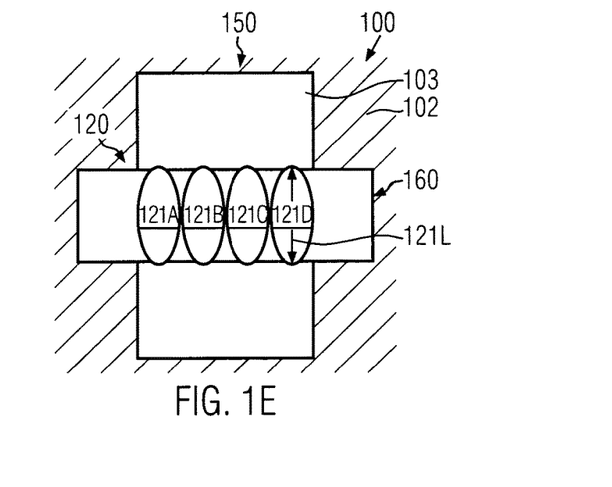

FIG. 1E schematically illustrates a top view of the semiconductor device 100 according to further illustrative embodiments, in which the high-k dielectric material 120 may comprise a substantially fixed number of grains and, thus, grains with substantially similar size. In the embodiment shown, four grains 121A-121D may be provided in the gate electrode structure 160, thereby providing the possibility of inducing a "multilevel" behavior, for instance, when providing the grains 121A-121D in a ferroelectric phase. That is, by achieving a substantially fixed number and size of the grains 121A-121D, a high degree of homogeneity across various devices may be achieved, while at the same time, within each individual device, such as the transistor element 150, a "stepped" or "leveled" material characteristic may be achieved, thereby, for instance, achieving the possibility of realizing different levels of response to an external electric field and the like, which may result in different electronic states of the transistor element 150.

It should be appreciated that, in the context of the present application, the size of a grain is to be considered as a maximum linear extension of a respective grain, irrespective of the specific geometric configuration, even if the grains may have a highly non-spherical shape. For instance, in FIG. 1E, the grain size may be indicated by the length 121L representing the maximum extension of the corresponding grains. Consequently, the grain size may be readily determined on the basis of electron microscopy and the like in actual semiconductor devices.

As a consequence, by engineering the grain size and/or the distribution of the grains in circuit elements, such as the transistor element 150, on the basis of process strategies, as described above and in particular as described in the following, not only improved control of the formation process of the high-k dielectric material itself and its characteristics may be achieved, but also superior performance of the respective circuit elements, such as the transistor element 150, may be obtained. That is, circuit elements, such as capacitors and transistor elements, may be formed on the basis of engineered grains and their distribution, thereby reducing device variations from device to device and from substrate to substrate. Furthermore, superior retention characteristics may be obtained by using the engineered grains and their distribution. Furthermore, by adjusting the grain size of the high-k dielectric material, the switching behavior of transistor elements may be tailored and may, therefore, enable the adaptation of transistor operation to design and function specific requirements.

With reference to FIGS. 2A-2E and 3A-3D, further illustrative embodiments and, in particular, process strategies, may now be described in more detail, so as to obtain a desired grain engineering as, for instance, discussed above with reference to FIGS. 1C-1E.

Figure 2A:
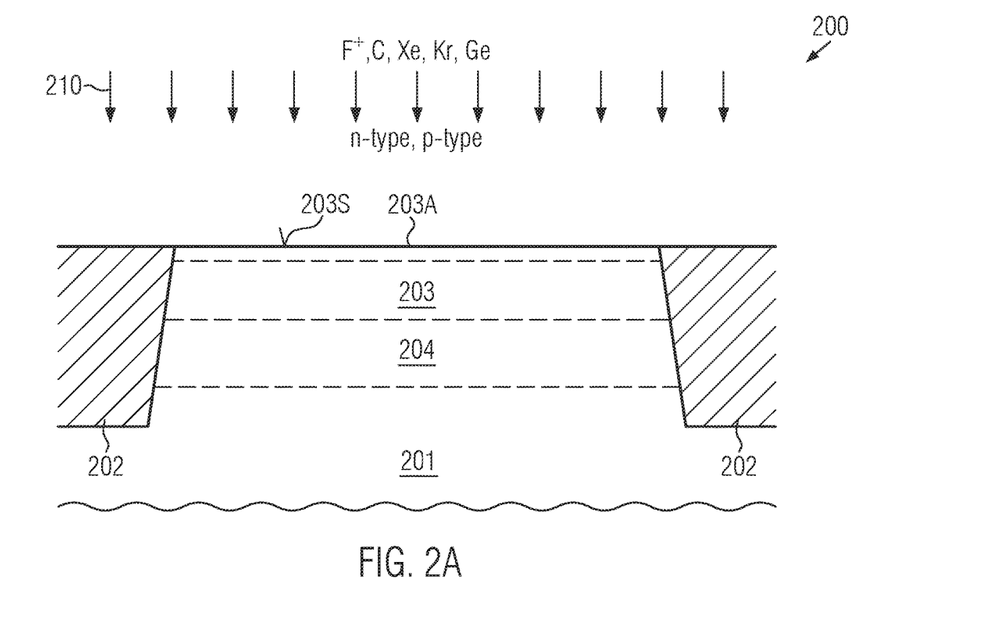
FIG. 2A schematically illustrates a cross-sectional view of a semiconductor device during one or more processes for modulating or modifying a surface area of a material layer that is positioned to enable influence on charge carriers of a semiconductor region, such as a channel region of a transistor element and the like, according to illustrative embodiments.

FIG. 2A schematically illustrates a cross-sectional view of a semiconductor device 200 in a relatively early manufacturing stage, i.e., prior to forming a high-k dielectric material, which, in some illustrative embodiments, may have to be formed so as to exhibit, at least in portions thereof, a ferroelectric phase. As illustrated, the semiconductor device 200 may comprise a substrate material 201, such as a silicon material, a germanium material or any other appropriate carrier material, which is appropriate for forming thereon an initial semiconductor layer, such as a crystalline silicon layer, a crystalline silicon/germanium layer, a crystalline germanium layer, or even amorphous thin layers, and the like, which may be divided into respective active semiconductor regions 203. To this end, an isolation structure 202, such as a trench isolation and the like, may be provided so as to laterally delineate the respective active semiconductor regions 203. The active semiconductor region 203, as already discussed above, may represent a semiconductor region in which electrostatic influence or charge carriers may have to be provided so as to obtain proper device functionality. For instance, the active semiconductor region 203 may represent a semiconductor region in which a channel region of a field effect transistor is to be formed, possibly in combination with drain and source regions or at least portions thereof. Furthermore, the semiconductor region 203 may have a surface layer 203A, which, in an early stage, may have substantially the same material composition as the remaining semiconductor region 203, which, however, may be modified or modulated in a subsequent manufacturing phase in order to specifically engineer the crystallinity of a high-k dielectric material to be formed in or on or above the semiconductor region 203 and the layer 203A. In this respect, the layer 203A may be understood as a material layer that is positioned to enable influence on charge carriers in the semiconductor region 203.

In some illustrative embodiments, the semiconductor device 200 may comprise a buried insulating layer 204 when an SOI architecture is to be used for at least some circuit elements of the semiconductor device 200. For instance, the buried insulating layer 204 may contain appropriate dielectric materials, such as silicon dioxide, silicon nitride and the like, and may, in some illustrative embodiments, also include or may be formed of a high-k dielectric material, as will be discussed in more detail later on when referring to FIGS. 3A-3D.

The semiconductor device 200 as shown in FIG. 2A may be formed in accordance with well-established process techniques, as already discussed above. That is, the material characteristics of the semiconductor region 203 may be adjusted on the basis of device requirements, for instance, by growing a specific crystalline semiconductor material, such as a silicon/germanium mixture and the like, in some device areas, depending on the overall requirements. It should be further appreciated that, in sophisticated applications, a fully depleted transistor configuration may have to be used, at least for some transistor elements of the semiconductor device 200, thereby requiring the adjustment of a thickness of the semiconductor region 203 to a value of 15 nm and significantly less. Furthermore, at any appropriate stage, dopant species may be incorporated as required, for instance, by implantation processes. Furthermore, the isolation structure 202 may be formed in accordance with a sophisticated process sequence in which respective trenches may be patterned on the basis of lithography techniques, the complexity of which may significantly depend on the critical dimensions of corresponding transistor elements to be formed in the semiconductor device 200. As discussed above, in sophisticated applications, vertical dimensions of 30 nm and significantly less may have to be realized in sophisticated semiconductor devices.

After filling the isolation trenches with appropriate materials and removing any excess material, the further processing may be continued by forming respective materials for gate electrode structures, wherein, prior to the deposition of high-k dielectric materials, a corresponding process or process sequence 210 may be applied in order to modify or modulate a surface 203S of the layer 203A, which may be provided in a specific condition prior to the treatment 210 in order to obtain, at least partially within the layer 203A, a different surface condition. In this respect, it should be appreciated that a "condition" or state of the surface 203S may be considered as being defined by one or more parameters, such as material composition at the surface 203S, which may include the presence of specific dopant species, such as N-type dopant species or P-type dopant species, which may result in a modification of the conductivity, at least at the surface 203S, while other "dopant" species, such as fluorine, carbon, germanium, xenon, krypton, argon and the like, may be considered as "inert" species, which may not significantly affect the overall electronic behavior. Other parameters for characterizing the condition or state of the surface 203S may be seen in a different material composition, which may have a significant different composition compared to the layer 203A, for instance, by depositing a thin layer or layer portion of such a material on the surface 203S and the like. Other parameters for characterizing the condition of the surface 203S may be the crystallographic status, i.e., crystalline, polycrystalline, substantially amorphized, and the like.

In some illustrative embodiments, the process or process sequence 210 may include the introduction of an ionic species, such as a dopant species for modifying the electronic behavior, or any of the above-specified inert species, by performing an implantation process, thereby selecting process parameters so as to restrict the effect of the implantation process to the layer 203A and, preferably, to the surface 203S. To this end, experiments may be performed so as to determine appropriate implantation parameters, such as dose and implantation energy for the respective species in order to obtain a desired modulation and, thus, a change of the condition of the surface 203S, however, without unduly affecting the actual active semiconductor region 203. For example, a moderately large implantation angle, i.e., an angle of the directional incoming particles with respect to the vertical direction of FIG. 2A, may be applied so as to also geometrically restrict the penetration depth of a respective species to the layer 203A, if further penetration of respective species is considered inappropriate. In other cases, the implantation process of the process 210 may be performed on the basis of a screen material (not shown), for instance, a silicon nitride material or a silicon dioxide material, which may be formed prior to the implantation process, thereby also providing superior process conditions in order to precisely restrict the penetration of the respective species to the layer 203A.

In other illustrative embodiments, a respective species may be incorporated into the semiconductor region 203 and may be positioned on the basis of a subsequent treatment, such as an anneal process, in order to appropriately distribute the species within the semiconductor region 203. In one illustrative embodiment, fluorine may be implanted into the semiconductor region 203 and a subsequent anneal process may result in a corresponding accumulation of fluorine species in the vicinity of the isolation structures 202. That is, in these embodiments, an increased concentration of fluorine species may be encountered at the border between the semiconductor region 203 and the isolation structure 202, thereby also obtaining a respective modulation of the surface 203S, which may, therefore, result in laterally modulated surface conditions upon depositing and forming a high-k dielectric material in a subsequent process sequence.

In other illustrative embodiments, a moderately high concentration of N-type or P-type or both types of dopant species may be incorporated by respective implantation sequences, thereby also contributing to a modulated surface 203S, which, in some illustrative embodiments, may have a substantially homogeneous surface condition after the implantation process compared to the condition prior to the implantation process.

In still other embodiments, the crystallographic configuration of the surface 203S may be modified, for instance, by bombarding the surface 203S with a relatively heavy species, such as germanium, xenon, krypton and the like, which may result in significant damage to the crystalline structure at the surface 203S at a moderately low dose, while penetration depth may also be restricted to the layer 203A, as discussed above.

Consequently, by introducing one or more species into the layer 203A, a corresponding modification or modulation of the surface conditions may be accomplished, wherein the corresponding effect on the subsequent formation of a high-k dielectric material and, in particular, in embodiments of a ferroelectric phase of a dielectric material, may be investigated on the basis of experiments so as to determine appropriate process parameters for the process or sequence 210. That is, when requiring the deposition of a high-k dielectric material in a subsequent manufacturing stage, wherein a thickness may have to be provided within, for instance, 8-12 nm, corresponding test substrates may be prepared and the effect of various aspects of the process or sequence 210 on the subsequent formation of the dielectric material may be investigated, for instance, by cross-sectional electron microscopy and the like.

As previously discussed, the surface potential, in particular, may have a significant influence on the stabilization of certain phases of the high-k dielectric material, wherein, for a given layer thickness, the surface modulation caused during the process or sequence 210 may result in a desired formation of grains, as discussed above with reference to FIGS. 1C-1E. For example, if the condition of the surface 203S is changed from a substantially crystalline state with a defined material composition prior to the process 210 into a highly doped state, with or without significant crystalline damage, the corresponding effect on the grain growth may be determined by respective experiments, thereby enabling determination of device specific parameters during the process or sequence 210. Similarly, respective experiments may be performed for other types of surface modulations, such as introducing fluorine species, boron species and the like, which may show a respective diffusion behavior upon annealing the device after the implantation process in order to obtain accumulated species concentrations at boundaries of the active semiconductor region 203, wherein these boundaries may act as respective growth boundaries for the corresponding grains and the like.

It should be appreciated that the process or sequence 210 may also include plasma-assisted treatments in which ionic species of a desired type may be accelerated to the surface 203S so as to adhere or lightly penetrate the material 203A, thereby also restricting the presence of the respective species to the layer 203A when further penetration is considered inappropriate.

Figure 2B:
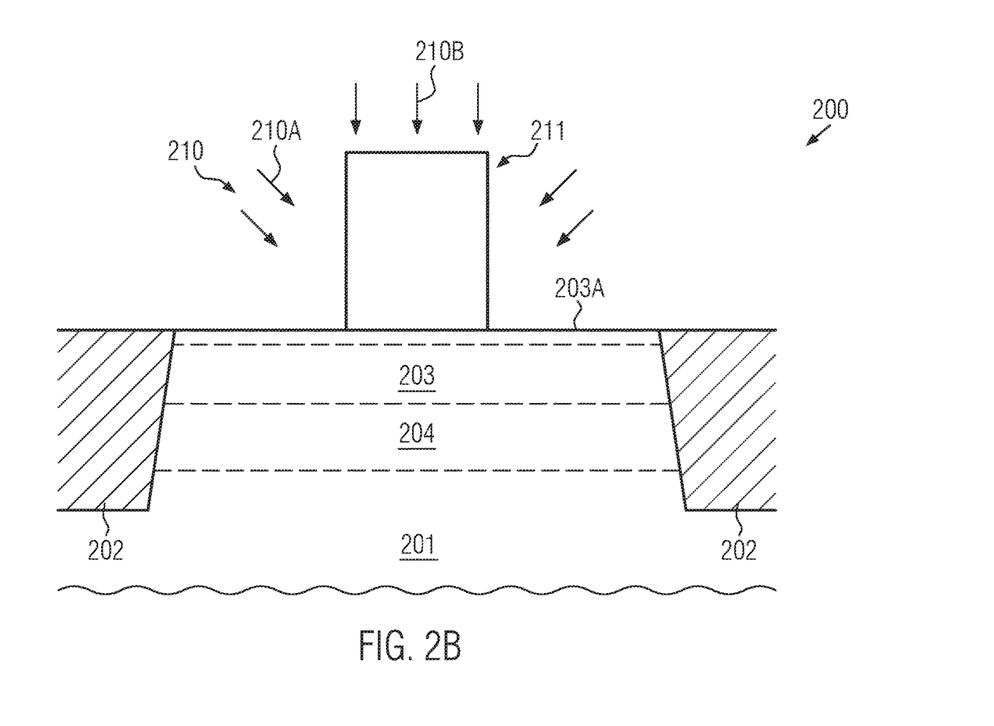
FIG. 2B schematically illustrates a cross-sectional view of a semiconductor device according to further illustrative embodiments, in which a surface modification or modulation may be achieved on the basis of a mask for locally structuring the effect of the modulation or modification.

FIG. 2B schematically illustrates the semiconductor device 200 according to illustrative embodiments in which the process or sequence 210 for modulating the surface conditions of the layer 203A may be performed on the basis of a masking regime, indicated by a mask 211. For example, when the modified layer 203A may have to be provided so as to correspond to the position of a gate electrode structure, the mask 211 may be used during an implantation process 210B, thereby substantially preserving the initial surface conditions below the mask 211, while obtaining the desired modulation in exposed areas. In other cases, if the initial surface conditions may have to be preserved in only a small portion of the active region 203, an angled implantation process 210A may be performed so as to provide the modified material layer 203A also below a portion of the mask 211. A corresponding structured modification of the layer 203A may be considered appropriate when a corresponding change of surface conditions may actually trigger a respective difference in grain growth, wherein respective parameters may also be readily determined on the basis of experiments, as discussed above with reference to FIG. 2A.

Figure 2C:
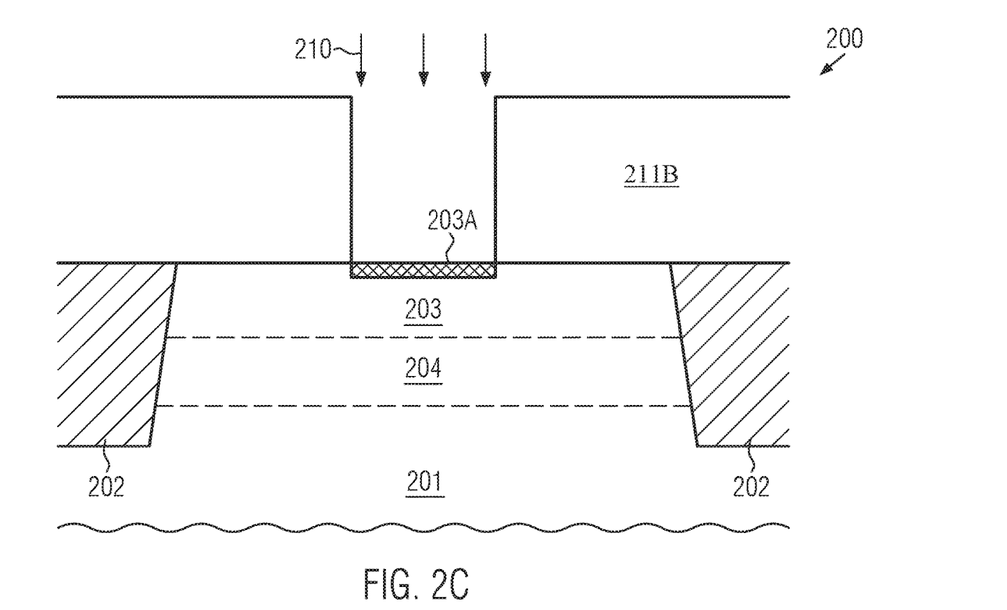
FIGS. 2C and 2D schematically illustrate cross-sectional views of the semiconductor device according to a further illustrative embodiment, in which a patterned modification or modulation of surface characteristics may be applied.

FIG. 2C schematically illustrates the semiconductor device 200 according to further illustrative embodiments in which a lateral patterning of the conditioning of the surface 203A may be performed on a mask 211B, for instance, during an implantation process of the sequence 210 and/or during a deposition process of the sequence 210 in order to obtain the modified material layer 203A having different surface conditions compared to the masked areas of the semiconductor region 203.

Figure 2D:
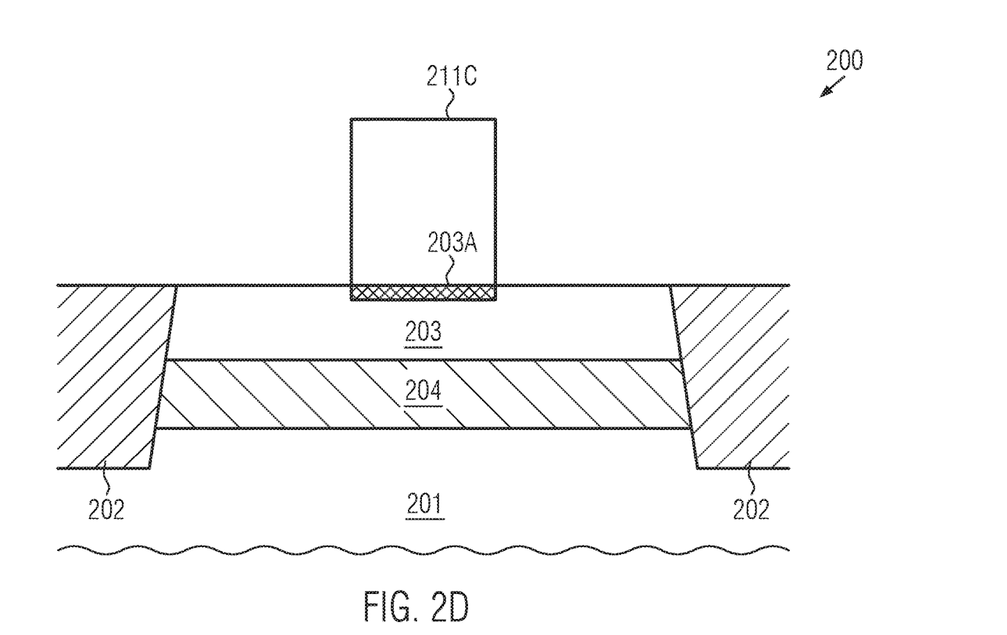

FIG. 2D schematically illustrates the semiconductor device 200 according to further illustrative embodiments in which a mask 211C may be used for providing modified surface conditions by forming a patterned material layer 203A covered by the mask 211C. For example, metal-including material systems may be provided in order to obtain an engineered growth for formation of a subsequent high-k dielectric material, wherein materials such as titanium oxide, titanium nitride, tantalum oxide, tantalum nitride and the like may be formed and patterned so as to provide modified surface conditions, as already discussed above. It should be appreciated that the mask 211C may represent a stack of layers for forming gate electrode structures which may be patterned on the basis of well-established lithography techniques, wherein the material layer 203A may represent a lowest layer that is in contact with the semiconductor region 203 and which may have provided respective surface conditions when a corresponding lateral patterning may not be necessary prior to the deposition and formation of the high-k dielectric material. In other cases, as shown, the mask 211C may be formed prior to actually forming the respective high-k dielectric material so as to provide the material layer 203A as a patterned layer, the position of which may substantially correspond to the position of a gate electrode structure still to be formed.

It should be appreciated that the semiconductor devices 200 as shown in FIGS. 2A-2D may be formed in accordance with well-established process strategies, wherein respective process parameters, species and the like for the process 210 may be additionally determined on the basis of experiments, as discussed above, in order to provide appropriate surface conditions for an engineered growth of a high-k dielectric material, which, in some illustrative embodiments, may stabilize in a ferroelectric phase. Moreover, a respective masking regime as, for instance, discussed with reference to the masks 211, 211B and 211C, may be accomplished on the basis of lithography techniques, as may also be used for patterning gate electrode structures and/or active regions, which may also typically require the application of sophisticated lithography techniques, for instance, based on immersion lithography and the like.

Figure 2E:
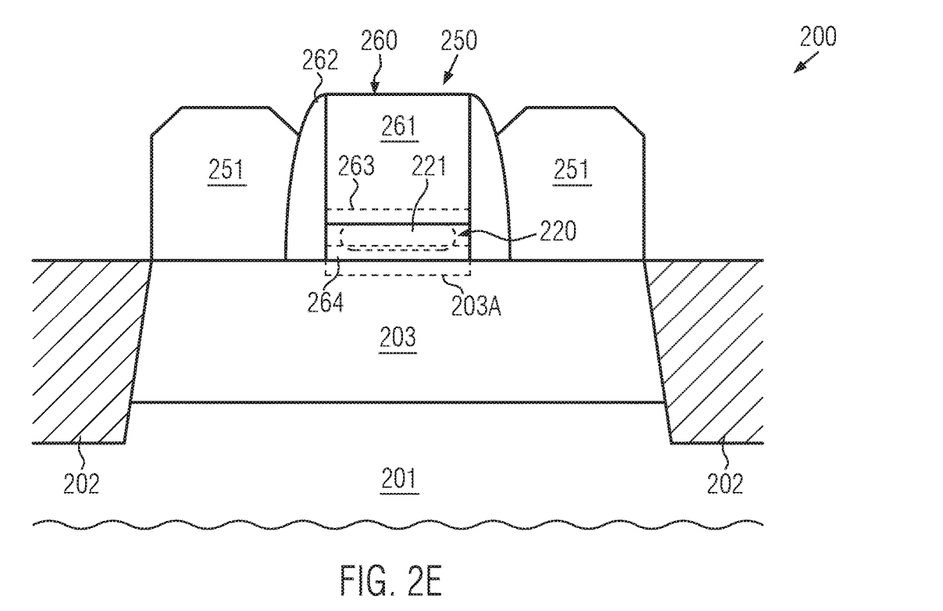
FIG. 2E schematically illustrates a cross-sectional view of a transistor element including a high-k dielectric material with specifically engineered crystallinity, for instance, with grains having ferroelectric phase, according to illustrative embodiments.

FIG. 2E schematically illustrates the semiconductor device 200 in a further advanced manufacturing stage. As illustrated, a transistor element 250 may be formed on the basis of the active semiconductor region 203, including at least a portion of the material layer 203A that may provide appropriate surface conditions upon forming a high-k dielectric material layer 220. As shown, the high-k dielectric material 220 may represent a part of a gate electrode structure 260, which may generally comprise an electrode material 261, sidewall spacers 262 and a gate dielectric material in the form of the material 220, possibly in combination with additional thin dielectric layers, such as silicon oxynitride and the like. Furthermore, the transistor element 250 may comprise drain and source regions 251, which, in the example shown in FIG. 2E, are provided as raised drain and source regions, while, in other cases, the drain and source regions 251 may be substantially incorporated in respective portions of the semiconductor region 203 laterally adjacent to the gate electrode structure 260.

Generally, the semiconductor device 200 as shown in FIG. 2E may be formed on the basis of the following processes. After conditioning the surface 203S (FIG. 2A) of the semiconductor region 203 and, thus, of the layer 203A, or at least a portion thereof as previously discussed with reference to FIGS. 2A-2D, the high-k dielectric material 220 may be formed, for instance, by sophisticated deposition techniques, such as ALD, plasma-enhanced ALD, metal-organic CVD and the like, wherein a desired material, in illustrative embodiments materials based on hafnium oxide, may be deposited with a specified thickness, for instance, with a thickness of 15 nm and significantly less, followed by a post-deposition treatment, if required, such as an anneal process and the like. As discussed above, due to the modulated surface conditions, the corresponding growth of grains in the material 220 may be initiated by one of the concepts referred to above or by a combination of two or more of these concepts, for instance, by incorporating an appropriate species in combination with providing one or more material systems indicated, for instance, by layers 264, 263, if considered appropriate. Consequently, upon forming the dielectric material 220 and after its patterning, a specific configuration of grains, for instance, as exemplified in FIGS. 1C-1E, may be obtained, thereby also adjusting the dielectric characteristics and, if the dielectric material 220 is stabilized in a ferroelectric phase, which may be accomplished on the basis of selecting process parameters during the process or sequence 210 (see FIGS. 2A-2D), which may not only be effective in engineering the grain growth but also in favoring a certain phase of the grains representing a ferroelectric phase or a phase that may be readily transferred into a ferroelectric phase during a subsequent treatment, such as an anneal treatment with rapid cooling and the like.

Thereafter, further materials may be deposited, for instance, the layer 263 in combination with one or more appropriate electrode materials 261, which may be patterned into the gate electrode structure 260, wherein at certain stages, the sidewall spacers 262 may also be formed. Depending on the required device configuration, the drain and source regions 251 may be formed by ion implantation and/or selective epitaxial growth techniques and the like.

Consequently, the transistor 250 may have the material 220 with material characteristics which may be provided with reduced fluctuations due to the grain engineering on the basis of the surface modulation, as discussed above. Consequently, in some illustrative embodiments, the dielectric characteristics of the layer 220 may be provided with superior uniformity, thereby providing the potential of implementing high-k dielectric materials with increased dielectric constant without significantly contributing to device non-uniformity, as may be the case in conventional strategies.

In other illustrative embodiments, the dielectric material 220 may be provided so as to establish a ferroelectric phase, wherein the ferroelectric behavior is also determined by an improved degree of uniformity compared to conventional strategies due to the previously explained grain engineering. Consequently, in this case, non-volatile storage mechanisms may be implemented in the transistor 250 without contributing to pronounced device non-uniformity.

In some illustrative embodiments, the material layer 203A may comprise crystalline germanium material, which may per se contribute to a surface modulation resulting in superior interface characteristics and, thus, reduced operating voltage for a ferroelectric phase of the dielectric material 220, when provided in the form of silicon-doped hafnium oxide, hafnium oxide, zirconium oxide and the like.

With reference to FIGS. 3A-3D, further illustrative embodiments will now be described in more detail, in which the mechanism of surface modulation may be applied to a dielectric material that may form or may be part of a buried insulating layer.

Figure 3A:
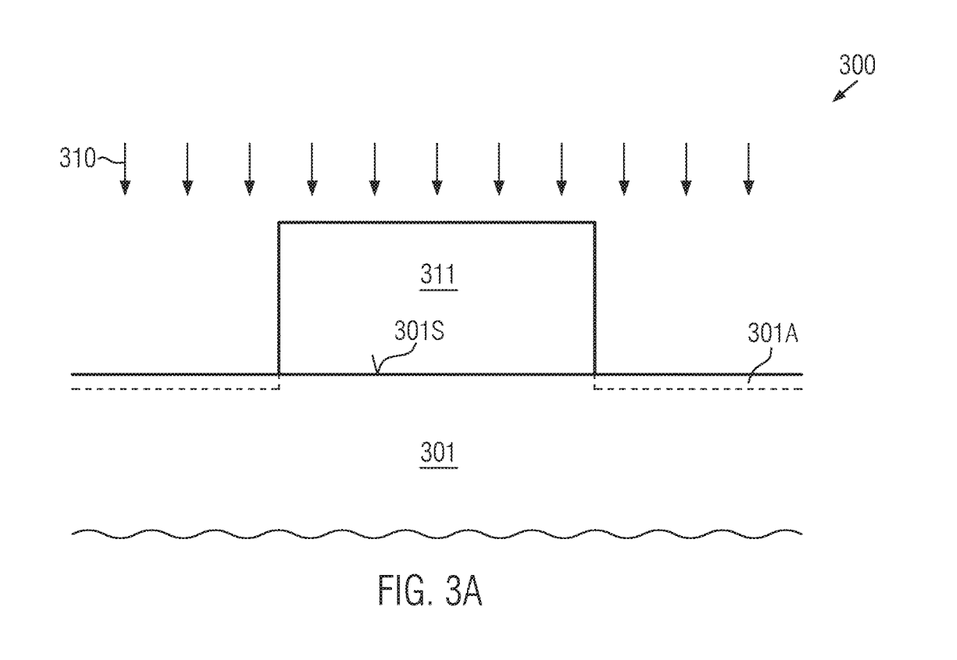
FIGS. 3A-3D schematically illustrate cross-sectional views of a semiconductor device in which a high-k dielectric material, for instance, with the capacity of establishing a ferroelectric phase, may be engineered by surface modulation as a part of a buried insulating material for semiconductor devices to be formed on the basis of an SOI architecture, according to still further embodiments.

FIG. 3A schematically illustrates a cross-sectional view of a semiconductor device 300 in an early manufacturing stage. That is, a substrate material, such as a crystalline silicon material or any other appropriate carrier material having formed thereon a crystalline semiconductor material, may include a material layer 301A, for instance, an upper portion of a crystalline substrate material, with a surface 301S, which may be at least partially modulated or modified in order to engineer the growth and formation of a dielectric material, as discussed above. That is, in some illustrative embodiments, a process or sequence 310 may be applied to bring at least a portion of the surface 301S from a first initial condition into a different second condition, wherein respective processes may be applied, as also discussed above with reference to the process or process sequence 210, 210A, 210B. As also discussed above, a process or sequence 310 may be applied to a relatively large portion of the substrate material 301, if a corresponding lateral structuring of the modified surface 301S may not be required. In other cases, appropriate lithography techniques may be applied in order to provide a mask 311 for defining regions of modified and non-modified surface areas.

Figure 3B:
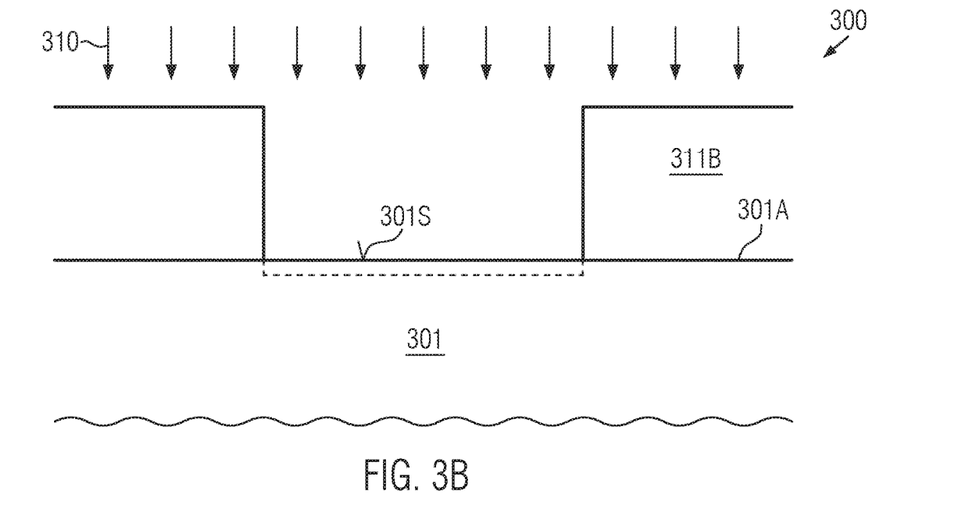

FIG. 3B schematically illustrates the semiconductor device 300 in accordance with other illustrative embodiments, wherein a mask 311B may result in the surface modification of the layer 301A in exposed areas during the process or sequence 310.

It should be appreciated that the masks 311, 311B, if required, may be formed on the basis of any well-established lithography techniques. It should be appreciated that the masks 311, 311B may also be used as deposition masks when the modulation of the surface 301S may have to be accomplished on the basis of the deposition of a specific material. In other cases, the deposition of a specific material may be accomplished in a non-mask manner and, subsequently, the corresponding material or material system deposited as one process step of the sequence 310 may be patterned on the basis of the masks 311, 311B as a further step of the sequence 310. It should be appreciated that, in addition to metal-containing materials, as discussed above, in particular, germanium in crystalline form may be provided at least in the material layer 301A in order to provide superior growth conditions during the subsequent deposition and formation of a high-k dielectric material.

Figure 3C:
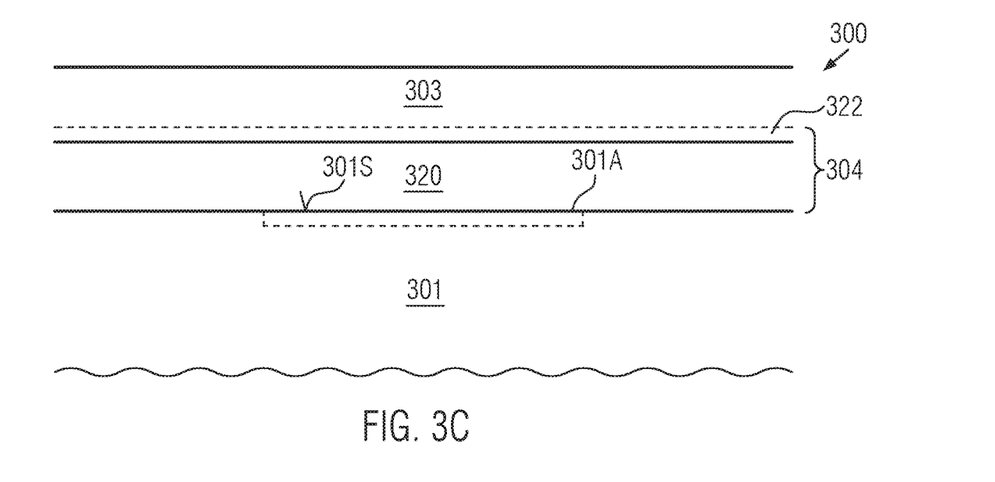

FIG. 3C schematically illustrates the semiconductor device 300 in a further advanced manufacturing stage. As illustrated, a high-k dielectric material 320 may be formed on the surface 301S, which, as indicated by the dashed line, may at least partially represent a surface of changed surface conditions, wherein the respective change may be accomplished by incorporating species, providing appropriate surface materials or any combination thereof, as discussed above. Consequently, at least in some portions, the dielectric material 320 may have an engineered crystallinity, for instance, engineered grains as specified with reference to FIGS. 1C-1E, thereby establishing desired dielectric characteristics, while, in other embodiments, desired ferroelectric characteristics may be achieved. The formation of the dielectric material 320 may be obtained on the basis of process parameters determined on the basis of conventional process strategies in combination with strategies as discussed above in order to obtain the desired configuration. If desired, a further dielectric material 322, such as a silicon dioxide material and the like, with appropriate thickness, may be provided on the basis of well-established process techniques. Consequently, the dielectric material 320 may be a buried insulating layer or at least a part thereof, possibly in combination with the layer 322 and any other dielectric material on which a semiconductor layer 303 may be provided, such as a crystalline silicon layer, a crystalline germanium layer and the like. The semiconductor layer 303 may be formed on the basis of well-established wafer bonding techniques and the like, as are usually applied for forming sophisticated SOI substrates. Consequently, in this configuration, these portions with specifically engineered configuration of the dielectric material 320 based on specifically engineered surface conditions may be considered as a material layer for influencing charge carriers in the semiconductor layer 303, i.e., in respective active regions still to be formed therein.

Figure 3D:
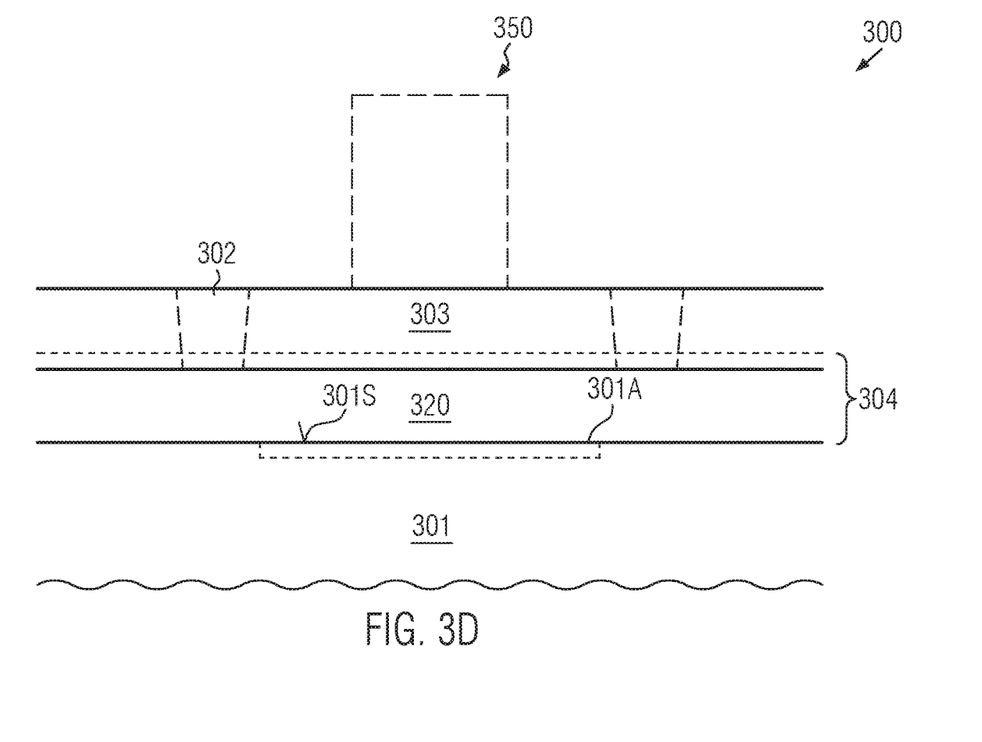

FIG. 3D schematically illustrates the semiconductor device 300 in a manufacturing stage in which an active region may be defined in the semiconductor layer 303 on the basis of isolation structures 302. Consequently, upon completing the transistor element 350, for instance, on the basis of well-established conventional process strategies or on the basis of process strategies previously discussed with reference to the transistor element 150 of FIGS. 1C-1E and the transistor 250 of FIG. 2E, the dielectric material 320, forming the buried insulating layer 304 or representing at least a part thereof, may provide additional functionality, such as a non-volatile storage mechanism, when the material 320 may be formed in a ferroelectric phase, while, in other cases, the superior growth and formation of the dielectric material 320 may provide increased dielectric constant with superior uniformity, as discussed above. Consequently, highly efficient back bias mechanisms may be implemented, while, in other cases, the non-volatile ferroelectric phase may be additionally utilized for enhancing the back bias mechanism and/or by providing additional non-volatile storage capabilities. In still other illustrative embodiments, a conventional gate electrode structure formed on the active region 303 may be omitted and may be replaced by the buried insulating layer 304 in combination with a portion of the substrate material 301. Also in this case, the superior configuration of the dielectric material 320 may result in enhanced uniformity of transistor performance.

As a result, the present disclosure provides process strategies and respective semiconductor devices in which the modulation of a surface potential of a material layer positioned to electrostatically influence charge carriers in a semiconductor region may result in superior uniformity of material characteristics of a dielectric material, for instance, by obtaining a desired configuration of respective grains of the dielectric material. When stabilizing the dielectric material with engineered grain growth in a non-polar phase, an increased dielectric constant may be typically achieved, with reduced fluctuation from device to device. In other illustrative embodiments, the dielectric material may be stabilized in a polar phase, thereby obtaining ferroelectric characteristics with superior uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
providing a material layer positioned to enable electrostatic influence on charge carriers in a semiconductor region of a semiconductor device, said material layer having a top surface at a first condition;
modulating at least a portion of said top surface of said material layer into a second condition that differs from said first condition in at least one surface relevant parameter; and
after modulating said at least a portion of said top surface of said material layer, forming a high-k dielectric material on said surface of said material layer, wherein said modulated second condition of said at least a portion of said top surface of said material layer is adapted to provide at least one of a predetermined size and a predetermined quantity of material grains in said high-k dielectric material.

2. The method of claim 1, wherein said high-k dielectric material is formed so as to establish a ferroelectric phase in at least a portion of said high-k dielectric material.

3. The method of claim 1, wherein modulating said at least a portion of said top surface of said material layer comprises introducing a species into said at least a portion of said top surface of said material layer.

4. The method of claim 3, wherein introducing said species into said at least a portion of said top surface of said material layer comprises introducing an ionic species by using at least one of ion implantation and plasma treatment.

5. The method of claim 3, wherein at least one of an N-type dopant species, a P-type dopant species, carbon, fluorine, xenon, krypton and germanium is introduced.

6. The method of claim 1, further comprising, prior to modulating said at least a portion of said top surface of said material layer, forming an isolation structure for laterally delineating said semiconductor region, said isolation structure having a top surface that is substantially coplanar with said top surface of said material layer during said modulating.

7. The method of claim 1, further comprising forming a buried insulating layer below said semiconductor region, wherein said high-k dielectric material is part of said buried insulating layer.

8. The method of claim 1, wherein modulating said at least a portion of said top surface of said material layer comprises forming a screening material layer on at least said portion of said top surface of said material layer.

9. The method of claim 8, wherein said screening material layer is formed so as to contain a metal species.

10. The method of claim 1, wherein modulating said at least a portion of said top surface of said material layer comprises forming a mask layer above said material layer.

11. The method of claim 10, further comprising performing at least one of a surface treatment and a material removal process by using said mask layer.

12. The method of claim 1, wherein said at least one of said predetermined size and said predetermined quantity of said material grains provided by said modulated second condition of said at least a portion of said top surface of said material layer comprises one of the following:
a single material grain having a size that is substantially a same size as a size of a semiconductor region that is covered by a gate electrode structure of said semiconductor device; or
a plurality of material grains each having substantially a same size.

13. The method of claim 12, wherein each of said plurality of material grains are substantially uniformly distributed over a portion of said semiconductor region that is covered by said gate electrode structure.

14. The method of claim 12, wherein said plurality of material grains is a fixed quantity of material grains each having a length that is substantially the same as a gate length of said gate electrode structure.

15. A method of forming a dielectric material in a semiconductor device, the method comprising:
introducing a species into at least a portion of a top surface of a material layer positioned to enable electrostatic influence on charge carriers in an active semiconductor region of a circuit element; and
after introducing said species, forming a dielectric material above said top surface of said material layer so as to establish a ferroelectric phase in at least a portion of said dielectric material, wherein said introduced species is adapted to provide at least one of a predetermined size and a predetermined quantity of material grains in said dielectric material.

16. The method of claim 15, wherein said species is introduced by at least one of ion implantation and plasma treatment.

17. The method of claim 15, wherein said material layer is a part of said active semiconductor region.

18. The method of claim 15, wherein said dielectric material is formed so as to be part of a buried insulating layer of said circuit element.

19. The method of claim 15, wherein introducing said species comprises introducing an ionic species into said active semiconductor region and annealing said active semiconductor region so as to drive said species toward an isolation structure laterally defining said active semiconductor region so that a concentration of said species in said active semiconductor region proximate said isolation structure is increased.

20. The method of claim 15, further comprising forming a mask layer and introducing said species by using said mask layer.

* * * * *